US012618874B2

(12) United States Patent
Tan et al.

(10) Patent No.: US 12,618,874 B2
(45) Date of Patent: May 5, 2026

(54) APPARATUS AND SYSTEM FOR NON-CONTACT CURRENT AND VOLTAGE COMPOSITE MEASUREMENT

(71) Applicant: Electric Power Research Institute of Yunnan Power Grid Co., Ltd., Kunming (CN)

(72) Inventors: Xiangyu Tan, Kunming (CN); Yong Lu, Kunming (CN); Wenyun Li, Kunming (CN); Yi Ma, Kunming (CN); Lijun Tang, Kunming (CN); Wenbin Zhang, Kunming (CN); Xiaowei Xu, Kunming (CN); Fangrong Zhou, Kunming (CN); Xingmei Zhou, Kunming (CN)

( * ) Notice: Subject to any disclaimer, the term of this patent is extended or adjusted under 35 U.S.C. 154(b) by 194 days.

(21) Appl. No.: 18/573,389

(22) PCT Filed: Aug. 30, 2023

(86) PCT No.: PCT/CN2023/115852
§ 371 (c)(1),
(2) Date: Dec. 21, 2023

(87) PCT Pub. No.: WO2024/087874
PCT Pub. Date: May 2, 2024

(65) Prior Publication Data
US 2025/0093390 A1 Mar. 20, 2025

(30) Foreign Application Priority Data
Oct. 27, 2022 (CN) .......................... 202211324692.6

(51) Int. Cl.
*G01R 15/14* (2006.01)
(52) U.S. Cl.
CPC .................................. *G01R 15/142* (2013.01)

(58) Field of Classification Search
CPC .. G01R 19/175; G01R 23/02; G01R 31/3842; G01R 17/00; G01R 25/00; G01R 27/02;
(Continued)

(56) References Cited

U.S. PATENT DOCUMENTS 4,794,327 A * 12/1988 Fernandes .............. G01R 15/26
340/657
5,341,088 A * 8/1994 Davis ................ H02J 13/00034
324/105
(Continued)

FOREIGN PATENT DOCUMENTS

CN 214122364 U 9/2021
CN 113759166 A 12/2021
(Continued)

*Primary Examiner* — Vinh P Nguyen

(57) ABSTRACT

An apparatus for non-contact current and voltage composite measurement includes: a current signal detection device, a voltage signal detection device, a zero-crossing detection circuit, and a control unit. The current signal detection device generates a current-induced electromotive force based on current flowing on the transmission line to be measured when there is current-voltage passing through the transmission line to be measured; the voltage signal detection device generates a voltage-induced electromotive force based on voltage flowing on the transmission line to be measured when there is current-voltage passing through the transmission line to be measured. The zero-crossing detection circuit performs zero-crossing detection on the current-induced electromotive force and the voltage-induced electromotive force to determine the phase difference between them. After calibrating the phase difference by the control unit, the control unit can simultaneously output current value, voltage value and power value of the transmission line to be measured.

9 Claims, 1 Drawing Sheet

(58) Field of Classification Search
    CPC ...... G01R 15/142; G01R 19/00; G01R 21/00;
                          G01R 21/06; G06F 18/2178
    See application file for complete search history.

(56)                        References Cited

U.S. PATENT DOCUMENTS

| | | | | |
|---|---|---|---|---|
| 5,473,244 | A | 12/1995 | Libove et al. | |
| 6,654,216 | B2 * | 11/2003 | Horvath ................. | H02H 7/261 |
| | | | | 361/65 |
| 8,508,212 | B2 * | 8/2013 | El-Essawy ............. | G01R 35/02 |
| | | | | 323/277 |
| 9,063,184 | B2 * | 6/2015 | Carpenter .............. | G01R 33/09 |
| 10,352,981 | B2 * | 7/2019 | Yu ........................... | G01R 31/58 |
| 10,775,409 | B2 * | 9/2020 | Worones ................ | G01R 15/12 |
| 2012/0319674 | A1 | 12/2012 | El-Essawy et al. | |

FOREIGN PATENT DOCUMENTS

| | | | |
|---|---|---|---|
| CN | 217467013 | * | 9/2022 |
| CN | 217467013 | U | 9/2022 |
| CN | 115541969 | A | 12/2022 |
| JP | 2012177571 | A | 9/2012 |
| KR | 20220093926 | A | 7/2022 |

* cited by examiner

Openable and closable
cylindrical housing
Transmission line
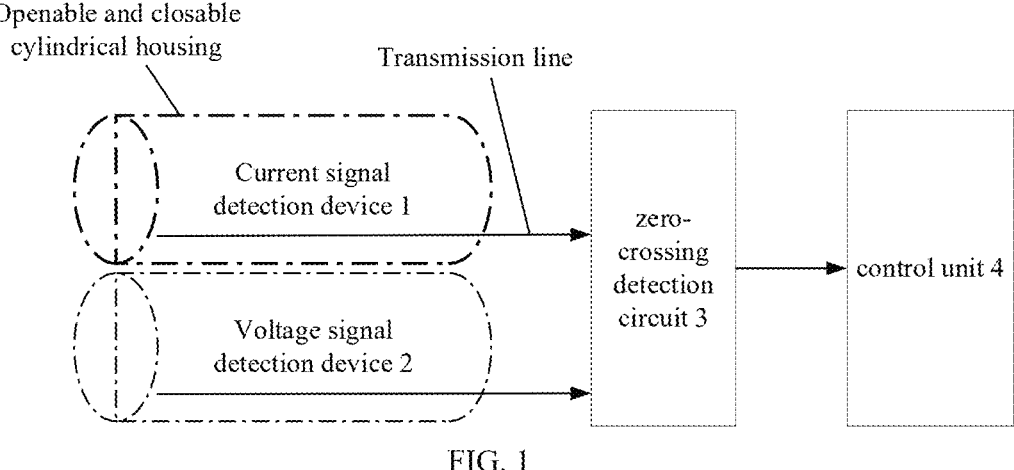
FIG. 1
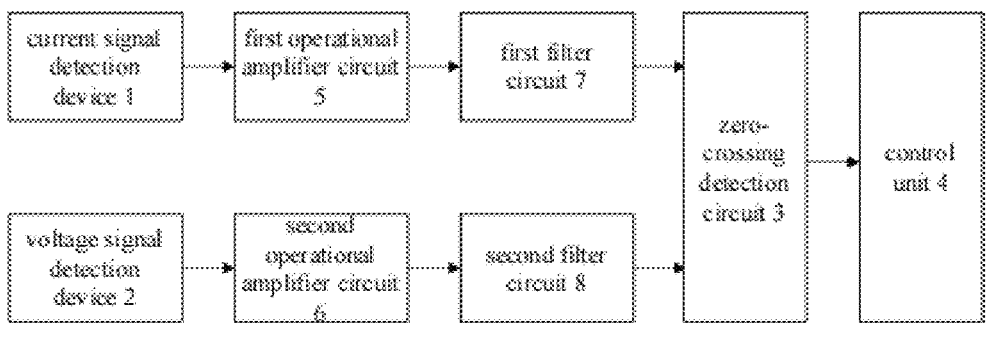
FIG. 2
FIG. 3

APPARATUS AND SYSTEM FOR NON-CONTACT CURRENT AND VOLTAGE COMPOSITE MEASUREMENT

TECHNICAL FIELD

The present disclosure relates to the technical field of electrical signal measurement, and in particular to an apparatus and a system for non-contact current and voltage composite measurement.

BACKGROUND

As interest in energy efficiency increases in commercial and residential locations, the need to measure power consumption in AC line powered systems is increasing more. In order to make an accurate measurement, the characteristics of the load and the current and voltage generated by the load must be taken into the considering. In the existing technology, current sensors and voltage sensors are generally used to measure the current and voltage of transmission lines. However, existing measurement apparatuses only can provide a single measurement result such as being for current or voltage, which cannot comply with the load measurement requirements of transmission lines.

SUMMARY OF INVENTION

In order to overcome, at least to a certain extent, the problem that measurement apparatuses in the related art only can provide a single measurement result such as being for current or voltage and cannot comply with the load measurement requirements of transmission lines, the present disclosure it to provide an apparatus and a system for non-contact current and voltage composite measurement.

The solution provided by the present disclosure is as follows:

According to a first aspect of embodiments of the present disclosure, an apparatus for non-contact current and voltage composite measurement is provided, including:

a current signal detection device, a voltage signal detection device, a zero-crossing detection circuit, and a control unit;

wherein the current signal detection device and the voltage signal detection device both include an openable and closable cylindrical housing;

wherein the zero-crossing detection circuit is respectively connected to the current signal detection device, the voltage signal detection device, and the control unit;

wherein the current signal detection device is fastened to a transmission line to be measured and is used to generate a current-induced electromotive force based on a current flowing on the transmission line to be measured when a current-voltage passes through the transmission line to be measured;

wherein the voltage signal detection device is fastened to the transmission line to be measured and is used to generate a voltage-induced electromotive force based on a voltage flowing on the transmission line to be measured when a current-voltage passes through the transmission line to be measured;

wherein the zero-crossing detection circuit is used to calculate a phase difference between the current-induced electromotive force and the voltage-induced electromotive force and to send a settlement result to the control unit;

wherein the control unit is used to calibrate the phase difference and then output a current value, a voltage value, and a power value of the transmission line to be measured.

Preferably, the apparatus further includes: a first operational amplifier circuit and a second operational amplifier circuit;

wherein the current signal detection device is connected to the zero-crossing detection circuit through the first operational amplifier circuit;

wherein the voltage signal detection device is connected to the zero-crossing detection circuit through the second operational amplifier circuit;

wherein the first operational amplifier circuit is used to amplify and output the current-induced electromotive force;

wherein the second operational amplifier circuit is used to amplify and output the voltage-induced electromotive force.

Preferably, the apparatus further includes: a first filter circuit and a second filter circuit;

wherein the current signal detection device is connected to the zero-crossing detection circuit through the first filter circuit;

wherein the voltage signal detection device is connected to the zero-crossing detection circuit through the second filter circuit;

wherein the first filter circuit is used to filter out signals other than power frequency in the current-induced electromotive force;

wherein the second filter circuit is used to filter signals other than power frequency in the voltage-induced electromotive force.

Preferably, the apparatus further includes:

an I/O output port;

wherein the control unit is connected to a host computer through the I/O output port and is used to output the current value, voltage value and power value of the transmission line to be measured to the host computer.

Preferably, the apparatus further includes: a power supply unit;

wherein the power supply unit is respectively connected to the current signal detection device, the voltage signal detection device, the zero-crossing detection circuit, and the control unit, and is used to provide operating current.

Preferably, the housings of the current signal detection device and the voltage signal detection device are made of different materials.

Preferably, the current signal detection device includes an openable and closable ferrite cylindrical housing;

wherein the voltage signal detection device includes an openable and closable metal cylindrical housing.

Preferably, the current signal detection device is provided with a Hall element or a giant magnetoresistance;

wherein the current signal detection device is used to generate a current-induced electromotive force based on a current flowing on the transmission line to be measured through the Hall element or the giant magnetoresistance when there is a current-voltage passing through the transmission line to be measured.

Preferably, the current signal detection device and the voltage signal detection device are fittingly arranged on the transmission line to be measured.

According to a second aspect of embodiments of the present disclosure, a system for non-contact current and voltage composite measurement is provided, including:

a host computer and an apparatus for non-contact current and voltage composite measurement as described in anyone of the above;

wherein the control unit in the apparatus for non-contact current and voltage composite measurement is communicatively connected with the host computer, and the control unit is used to output the current value, the voltage value, and the power value of the transmission line to be measured to the host computer.

The technical solution provided by the present disclosure can include the following beneficial effects: providing an apparatus for non-contact current and voltage composite measurement is provided, which includes: a current signal detection device, a voltage signal detection device, a zero-crossing detection circuit, and a control unit. The zero-crossing detection circuit is respectively connected to the current signal detection device, the voltage signal detection device, and the control unit. The current signal detection device and the voltage signal detection device both include an openable and closable cylindrical housing, and they can be fastened to the transmission line to be measured during actual measurement to perform non-contact measurement. During implementation, the current signal detection device is used to generate a current-induced electromotive force based on a current flowing on the transmission line to be measured when a current-voltage passes through the transmission line to be measured; the voltage signal detection device is used to generate a voltage-induced electromotive force based on a voltage flowing on the transmission line to be measured when a current-voltage passes through the transmission line to be measured. The zero-crossing detection circuit performs zero-crossing detection on the current-induced electromotive force and the voltage-induced electromotive force to determine the phase difference between them and sends the settlement result to the control unit. The control unit is used to calibrate the phase difference and then simultaneously output a current value, a voltage value, and a power value of the transmission line to be measured. In the technical solution of the present disclosure, as a composite measuring apparatus, it can not only output the current value and voltage value of the transmission line to be measured simultaneously, but also calculate and output the power value of the transmission line to be measured, which can better comply with the load measurement requirements of the transmission lines.

It should be understood that the above general description and the following detailed description are only exemplary and explanatory, and do not limit the present disclosure.

BRIEF DESCRIPTION OF DRAWINGS

The drawings here are incorporated into the specification and serve as a part of this specification, illustrating embodiments consistent with the present disclosure and, together with the specification, used to explain the principles of the present disclosure.

FIG. 1 is a schematic structural diagram of an apparatus for non-contact current and voltage composite measurement according to an embodiment of the present disclosure;

FIG. 2 is a schematic structural diagram of another apparatus for non-contact current and voltage composite measurement according to an embodiment of the present disclosure;

FIG. 3 is a schematic structural diagram of a system for non-contact current and voltage composite measurement according to an embodiment of the present disclosure.

Reference numbers: current signal detection device—1; voltage signal detection device—2; zero—crossing detection circuit—3; control unit—4; first operational amplifier circuit—5; second operational amplifier circuit—6; first filter circuit—7; second filter circuit—8; I/O output port—9; power supply unit—10; host computer—11.

DETAILED DESCRIPTION OF THE INVENTION

Exemplary embodiments will be described in detail herein, examples of which are illustrated in the accompanying drawings. As the following description refers to the drawings, the same numbers in different drawings refer to the same or similar elements unless otherwise indicated. The implementations described in the following exemplary embodiments do not represent all implementations consistent with the present disclosure. On the contrary, they are merely examples of apparatus and methods consistent with aspects of the application as detailed in the appended claims.

Embodiment 1

FIG. 1 is a schematic structural diagram of an apparatus for non-contact current and voltage composite measurement provided by one embodiment according to the present embodiment, referring to FIG. 1, an apparatus for non-contact current and voltage composite measurement is provided, including:

a current signal detection device 1, a voltage signal detection device 2, a zero-crossing detection circuit 3, and a control unit 4;

in which the current signal detection device 1 and the voltage signal detection device 2 both include an openable and closable cylindrical housing;

in which the zero-crossing detection circuit 3 is respectively connected to the current signal detection device 1, the voltage signal detection device 2, and the control unit 4;

in which the current signal detection device 1 is fastened to a transmission line to be measured and is used to generate a current-induced electromotive force based on a current flowing on the transmission line to be measured when a current-voltage passes through the transmission line to be measured;

in which the voltage signal detection device 2 is fastened to the transmission line to be measured and is used to generate a voltage-induced electromotive force based on a voltage flowing on the transmission line to be measured when a current-voltage passes through the transmission line to be measured;

in which the zero-crossing detection circuit 3 is used to calculate a phase difference between the current-induced electromotive force and the voltage-induced electromotive force and to send a settlement result to the control unit 4;

in which the control unit 4 is used to calibrate the phase difference and then output a current value, a voltage value, and a power value of the transmission line to be measured.

It should be noted, the housings of the current signal detection device 1 and the voltage signal detection device 2 are made of different materials.

In specific practice, the current signal detection device 1 includes an openable and closable ferrite cylindrical housing;

the voltage signal detection device 2 can include an openable and closable metal cylindrical housing.

Preferably, the current signal detection device 1 is provided with a Hall element or a giant magnetoresistance;

in which the current signal detection device 1 is used to generate a current-induced electromotive force based on a current flowing on the transmission line to be measured through the Hall element or the giant magnetoresistance when there is a current-voltage passing through the transmission line to be measured.

It should be noted that the working principle of the technical solution in the present embodiment is: when there is current and voltage passing through the transmission line to be measured, since the device containing the ferrite cylinder and the metal cylinder is fastened on the transmission line to be measured, the magnetic field and electric field around the transmission line to be measured change as the current and voltage change. The Hall element or giant magnetoresistance in the openable and closable ferrite cylindrical housing can induce a current-induced electromotive force, in which, the current induced electromotive force is proportional to the derivative of the current flowing through the transmission line to be measured. The openable and closable metal cylindrical housing can obtain voltage induced electromotive force, in which the voltage induced electromotive force is proportional to the voltage flowing through the transmission line to be measured.

In the zero-crossing detection circuit 3, the phase difference between the current-induced electromotive force and the voltage-induced electromotive force is calculated through a phase detector, and then the phase difference in waveform is input to the control unit 4. The control unit 4 outputs an accurate current value, a voltage value, and a power value of the transmission line to be measured through calculation, compensation, calibration and the likes.

In specific practice, the control unit 4 may use a single-chip microcomputer.

It should be noted that the current signal detection device 1 and the voltage signal detection device 2 are fittingly arranged on the transmission line to be measured.

It can be understood that in order to reduce the impact on the transmission line to be measured, the current signal detection device 1 and the voltage signal detection device 2 in the present embodiment are disposed fittingly on the transmission line to be measured, such that the coverage area of the transmission line to be measured reduces, thereby reducing the impact on the transmission lines to be measured.

In the present embodiments, the apparatus for non-contact current and voltage composite measurement is provided, which includes: the current signal detection device 1, the voltage signal detection device 2, the zero-crossing detection circuit 3, and the control unit 4. The zero-crossing detection circuit 3 is respectively connected to the current signal detection device 1, the voltage signal detection device 2, and the control unit 4. The current signal detection device 1 and the voltage signal detection device 2 both include an openable and closable cylindrical housing, and they can be fastened to the transmission line to be measured during actual measurement to perform non-contact measurement. During implementation, the current signal detection device 1 is used to generate a current-induced electromotive force based on a current flowing on the transmission line to be measured when a current-voltage passes through the transmission line to be measured; the voltage signal detection device 2 is used to generate a voltage-induced electromotive force based on a voltage flowing on the transmission line to be measured when a current-voltage passes through the transmission line to be measured. The zero-crossing detection circuit 3 performs zero-crossing detection on the current-induced electromotive force and the voltage-induced electromotive force to determine the phase difference between them and sends the settlement result to the control unit 4. The control unit 4 is used to calibrate the phase difference and then simultaneously output a current value, a voltage value, and a power value of the transmission line to be measured. In the technical solution of the present embodiment, as a composite measuring apparatus, it can not only output the current value and the voltage value of the transmission line to be measured simultaneously, but also calculate and output the power value of the transmission line to be measured, which can better comply with the load measurement requirements of the transmission lines.

Embodiment 2

It should be noted that, referring to FIG. 2, the apparatus for non-contact current and voltage composite measurement further includes: a first operational amplifier circuit 5 and a second operational amplifier circuit 6;

in which the current signal detection device 1 is connected to the zero-crossing detection circuit 3 through the first operational amplifier circuit 5;

in which the voltage signal detection device 2 is connected to the zero-crossing detection circuit 3 through the second operational amplifier circuit 6;

in which the first operational amplifier circuit 7 is used to amplify and output the current-induced electromotive force;

in which the second operational amplifier circuit 8 is used to amplify and output the voltage-induced electromotive force.

It can be understood that the current-induced electromotive force generated by the current signal detection device 1 and the voltage-induced electromotive force signal generated by the voltage signal detection device 2 are very small, so, in the present embodiment, such the weak signals are amplified by operational amplifiers to facilitate subsequent calculations.

It should be noted that, referring to FIG. 2, the apparatus for non-contact current and voltage composite measurement further includes: a first filter circuit 7 and a second filter circuit 8;

in which the current signal detection device 1 is connected to the zero-crossing detection circuit 3 through the first filter circuit 7;

in which n the voltage signal detection device 2 is connected to the zero-crossing detection circuit 3 through the second filter circuit 8;

in which the first filter circuit 7 is used to filter out signals other than power frequency in the current-induced electromotive force;

in which the second filter circuit 8 is used to filter signals other than power frequency in the voltage-induced electromotive force.

It can be understood that the current-induced electromotive force generated by the current signal detection device 1 and the voltage-induced electromotive force signal generated by the voltage signal detection device 2 may contain certain impurity signals. In the present embodiment, the subsequent signal processing only needs to obtain the power frequency signal in the induced electromotive force signal, so it is necessary to filter out impurity signals other than power frequency in the induced electromotive force signal.

It should be noted that, referring to FIG. 2, the apparatus for non-contact current and voltage composite measurement further includes: an I/O output port 9;

In which the control unit 4 is connected to a host computer 11 through the I/O output port 9 and is used to output the current value, voltage value and power value of the transmission line to be measured to the host computer 11.

It can be understood that, in the present embodiment, the control unit 4 is connected to the host computer 11 through the I/O output port 9 and outputs the current value, the voltage value and the power value of the transmission line to be measured to the host computer 11, so as to display the current value, the voltage value and the power value of the transmission line to be measured on the host computer 11.

It should be noted that, referring to FIG. 2, the apparatus for non-contact current and voltage composite measurement further includes: a power supply unit 10;

in which the power supply unit 10 is respectively connected to the current signal detection device 1, the voltage signal detection device 2, the zero-crossing detection circuit 3, and the control unit 4, and is used to provide operating current.

It can be understood that the power supply unit 10 is used to provide operating current to the current signal detection device 1, the voltage signal detection device 2, the zero-crossing detection circuit 3, and the control unit 4. Preferably, the power supply unit 10 is configured with a power switch; when the power switch is turned on, the power supply unit 10 supplies power; and when the power switch is turned off, the power supply unit 10 stops power supplying.

Embodiment 3

A system for non-contact current and voltage composite measurement is provided, referring to FIG. 3, including:

a host computer 11, and an apparatus for non-contact current and voltage composite measurement as described in anyone of claims 1-9;

in which the control unit 4 in the apparatus for non-contact current and voltage composite measurement is communicatively connected with the host computer 11, and the control unit 4 is used to output the current value, the voltage value, and the power value of the transmission line to be measured to the host computer 11.

It can be understood that, taking power grid current and voltage monitoring as an example, apparatus for non-contact current and voltage composite measurement is installed on each transmission line to be measured in the transformer station area, and current, voltage, power values of each transmission line to be measured can be measured and reported in real time. The host computer 11 is used to count and display the current s, voltage, and power values of each transmission line to be measured. The management operators can determine the power consumption in the circuit based on the current value, the voltage value and the power value of each transmission line to be measured displayed by the host computer 11 and thus calculate the network topology, realizing energy control of distribution network.

It can be understood that the same or similar parts in the above-mentioned embodiments can be referred to each other, and the content that is not described in detail in some embodiments can be referred to the same or similar content in other embodiments.

It should be noted that in the description of the present disclosure, the terms "first", "second", etc. are only used for descriptive purposes and cannot be understood as indicating or implying relative importance. Furthermore, in the description of the present disclosure, unless otherwise stated, the meaning of "plurality" means at least two.

Any process or method description in the flowchart or otherwise provided herein can be understood as representing modules, segments, or portions of code comprising one or more executable instructions for implementing specific logical functions or processes. The scope of preferred embodiments of the present disclosure includes alternative implementations, where functionalities may be performed in a different order than shown or discussed, including, but not limited to, simultaneously or in reverse order based on the functions involved, as would be understood by those skilled in the art of the technical field to which the embodiments of the present disclosure belong.

It should be understood that various parts of the present disclosure can be implemented in hardware, software, firmware, or a combination thereof. In the above embodiments, various steps or methods may be implemented in software or firmware stored in a memory and executed by a suitable instruction execution system. For example, if it is implemented in hardware, as in another embodiment, it can be implemented by any one or a combination of the following technologies known in the art: a discrete logic circuit with logic gate circuits for implementing logical functions on data signals, specialized integrated circuits with appropriate combination logic gate circuits, programmable gate arrays (PGA), field-programmable gate arrays (FPGA), and the like.

Those skilled in the art of this technical field can understand that all or some steps carried out in the methods of the above embodiments can be instructed by a program to be completed by relevant hardware. The program can be stored on a computer-readable storage medium, and when executed, includes one or a combination of steps from the method embodiments.

Additionally, in various embodiments of the present disclosure, each functional unit can be integrated into a processing module, exist separately in a physical form, or be integrated into a module with two or more units. The integrated modules mentioned above can be implemented either in hardware or in the form of software functional modules. If the integrated module is implemented in the form of a software functional module and sold or used as an independent product, it can also be stored in a computer-readable storage medium.

The storage medium as afore-mentioned can be read-only memory, a disk, an optical disc, etc.

In the description of this specification, reference terms such as "an embodiment," "some embodiments," "examples," "specific examples," or "some examples" are intended to mean that the specific features, structures, materials, or characteristics described in conjunction with that embodiment or example are included in at least one embodiment or example of the present disclosure. In this specification, the illustrative expression of the above terms does not necessarily refer to the same embodiment or example. Moreover, specific features, structures, materials, or characteristics described can be appropriately combined in any one or more embodiments or examples.

Although embodiments of the present disclosure have been shown and described above, it should be understood that these embodiments are exemplary and should not be construed as limiting the present disclosure. Those skilled in the art can make changes, modifications, substitutions, and variations to the above embodiments within the scope of the present disclosure.

What is claimed is:

1. An apparatus for non-contact current and voltage composite measurement, comprising:

a current signal detection device, a voltage signal detection device, a zero-crossing detection circuit, and a control unit;

wherein the current signal detection device and the voltage signal detection device both comprises an openable and closable cylindrical housing for each;

wherein the zero-crossing detection circuit is respectively connected to the current signal detection device, the voltage signal detection device, and the control unit;

wherein the current signal detection device is fastened to a transmission line to be measured and is used to generate a current-induced electromotive force based on a current flowing on the transmission line to be measured when a current-voltage passes through the transmission line to be measured;

wherein the voltage signal detection device is fastened to the transmission line to be measured and is used to generate a voltage-induced electromotive force based on a voltage flowing on the transmission line to be measured when a current-voltage passes through the transmission line to be measured;

wherein the zero-crossing detection circuit is used to calculate a phase difference between the current-induced electromotive force and the voltage-induced electromotive force and to send a settlement result to the control unit;

wherein the control unit is used to calibrate the phase difference and then output a current value, a voltage value, and a power value of the transmission line to be measured;

wherein the apparatus further comprises: a first operational amplifier circuit and a second operational amplifier circuit;

wherein the current signal detection device is connected to the zero-crossing detection circuit through the first operational amplifier circuit;

wherein the voltage signal detection device is connected to the zero-crossing detection circuit through the second operational amplifier circuit;

wherein the first operational amplifier circuit is used to amplify and output the current-induced electromotive force;

wherein the second operational amplifier circuit is used to amplify and output the voltage-induced electromotive force.

2. The apparatus according to claim 1, wherein the apparatus further comprises: a first filter circuit and a second filter circuit;

wherein the current signal detection device is connected to the zero-crossing detection circuit through the first filter circuit;

wherein the voltage signal detection device is connected to the zero-crossing detection circuit through the second filter circuit;

wherein the first filter circuit is used to filter out signals other than power frequency in the current-induced electromotive force;

wherein the second filter circuit is used to filter signals other than power frequency in the voltage-induced electromotive force.

3. The apparatus according to claim 1, wherein the apparatus further comprises:

an I/O output port;

wherein the control unit is connected to a host computer through the I/O output port and is used to output the current value, voltage value and power value of the transmission line to be measured to the host computer.

4. The apparatus according to claim 1, wherein the apparatus further comprises: a power supply unit;

wherein the power supply unit is respectively connected to the current signal detection device, the voltage signal detection device, the zero-crossing detection circuit, and the control unit, and is used to provide operating current.

5. The apparatus according to claim 1, wherein the housings of the current signal detection device and the voltage signal detection device are made of different materials.

6. The apparatus according to claim 5, wherein the current signal detection device comprises an openable and closable ferrite cylindrical housing;

wherein the voltage signal detection device comprises an openable and closable metal cylindrical housing.

7. The apparatus according to claim 1, wherein the current signal detection device is provided with a Hall element or a giant magnetoresistance;

wherein the current signal detection device is used to generate a current-induced electromotive force based on a current flowing on the transmission line to be measured through the Hall element or the giant magnetoresistance when there is a current-voltage passing through the transmission line to be measured.

8. The apparatus according to claim 1, wherein the current signal detection device and the voltage signal detection device are fittingly arranged on the transmission line to be measured.

9. A system for non-contact current and voltage composite measurement, comprising:

a host computer and the apparatus for non-contact current and voltage composite measurement according to claim 1;

wherein the control unit in the apparatus for non-contact current and voltage composite measurement is communicatively connected with the host computer, and the control unit is used to output the current value, the voltage value, and the power value of the transmission line to be measured to the host computer.

* * * * *